US008945340B2

United States Patent
Saito

(10) Patent No.: US 8,945,340 B2
(45) Date of Patent: Feb. 3, 2015

(54) PLASMA PROCESSING APPARATUS, AND MAINTENANCE METHOD AND ASSEMBLING METHOD OF THE SAME

(75) Inventor: Masashi Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 441 days.

(21) Appl. No.: 12/705,141

(22) Filed: Feb. 12, 2010

(65) Prior Publication Data

US 2010/0204810 A1    Aug. 12, 2010

(30) Foreign Application Priority Data

Feb. 12, 2009 (JP) ................ 2009-030459

(51) Int. Cl.
  C23C 16/00 (2006.01)
  C23F 1/00 (2006.01)
  H01L 21/306 (2006.01)
  H01J 37/32 (2006.01)

(52) U.S. Cl.
  CPC ..... *H01J 37/32522* (2013.01); *H01J 37/32834* (2013.01)
  USPC ........ 156/345.29; 118/715; 118/719

(58) Field of Classification Search
  CPC .............. H01J 37/3262; H01J 37/328343
  USPC .............. 156/345.29; 118/715, 719
  See application file for complete search history.

(56) References Cited

U.S. PATENT DOCUMENTS 6,156,151 A * 12/2000 Komino et al. .......... 156/345.29
6,402,848 B1 * 6/2002 Horiguchi et al. ............ 118/715
2002/0002948 A1 * 1/2002 Hongo et al. ............. 118/723 R
2005/0167052 A1 * 8/2005 Ishihara et al. .......... 156/345.47
2005/0173066 A1 * 8/2005 Sugano .................... 156/345.29
2007/0034159 A1   2/2007 Komino et al.
2007/0095283 A1 * 5/2007 Galewski .................... 118/715
2009/0325386 A1 * 12/2009 Devine et al. ................ 438/706
2010/0272895 A1 * 10/2010 Tsuda ...................... 427/255.32
2011/0005680 A1 * 1/2011 Balakrishna et al. ..... 156/345.33

FOREIGN PATENT DOCUMENTS

| JP | 5-321835 A | 12/1993 | |
|---|---|---|---|
| JP | 6-31154 | 2/1994 | |
| JP | 7-161643 | 6/1995 | |
| JP | 10-321605 | * 12/1998 | .......... H01L 21/3065 |
| JP | 2000-58298 | 2/2000 | |
| JP | 2000-243596 A | 9/2000 | |

(Continued)

OTHER PUBLICATIONS

Machine Translation JP07161643, Munenori et al dated Jun. 23, 1995.*

(Continued)

*Primary Examiner* — Rakesh Dhingra
(74) *Attorney, Agent, or Firm* — Rothwell, Figg, Ernst & Manbeck, P.C.

(57) ABSTRACT

A plasma processing apparatus includes a processing chamber that converts a processing gas introduced from a gas supply source into plasma and performs plasma processing on a target object, an exhaust chamber that communicates with the inside of the processing chamber to exhaust a gas converted into plasma from the processing chamber, and a blocking cover that is provided in the exhaust chamber to block communication between the inside of the processing chamber and the inside of the exhaust chamber.

4 Claims, 14 Drawing Sheets

(56) References Cited

FOREIGN PATENT DOCUMENTS

| | | |
|---|---|---|
| JP | 2002-329708 A | 11/2002 |
| JP | 2002-355545 | 12/2002 |
| JP | 2008-251969 A | 10/2008 |
| WO | 2004/105103 A1 | 12/2004 |
| WO | WO 2009041282 * | 4/2009 .............. C23C 16/06 |

OTHER PUBLICATIONS

English Machine Machine Translation JP10321605, Koshimizu dated Dec. 4, 1998.*

* cited by examiner

PLASMA PROCESSING APPARATUS, AND MAINTENANCE METHOD AND ASSEMBLING METHOD OF THE SAME

CROSS-REFERENCE TO RELATED APPLICATIONS

This application claims priority to Japanese Patent Application No. 2009-030459 filed on Feb. 12, 2009, the entire contents of which are incorporated herein by reference.

FIELD OF THE INVENTION

The present invention is related to a plasma processing apparatus, a maintenance method and an assembling method of a plasma processing apparatus.

BACKGROUND OF THE INVENTION

In a plasma processing apparatus, a target object is micro processed by plasma. For example, in a plasma etching processing apparatus shown in FIG. 9, an upper electrode 905 and a lower electrode 910 are arranged to be opposite to each other in a processing vessel 900 to generate plasma between the electrodes 905 and 910. The upper electrode 905 includes a gas shower head 905a and a quartz shield 905b, and a deposit shield 915 surrounding the quartz shield 905b.

A baffle plate 925 is arranged at the periphery of a susceptor 920, which is connected to a high frequency power supply 935 via a matching unit 930. A gas supplied from a gas supply source 940 is introduced to the inside of the processing vessel from the shower header 905a and converted into plasma by high frequency electric field energy applied from the high frequency power supply 935 and an etching process is performed on a wafer W by using the plasma.

An exhaust port 945 is connected to an automatic pressure control ("APC") valve 950 which is in turn connected to a turbo molecular pump ("TMP") 955. A roughing vacuum pump 960 (hereinafter, referred to as "DRY") 960 is arranged at the rear side of the TMP 955. The inside of the processing vessel 900 is roughly exhausted by the DRY 960, and vacuum exhausted by the TMP 955 with the opening degree of a body of the APC 950 controlled. During the process, the inside of the processing vessel is vacuum exhausted to maintain air-tightness.

Hereinafter, a part of the processing vessel, which defines a wafer processing space U1 that is partitioned by the baffle plate 925 and arranged over the susceptor 920, is referred to as a processing chamber PC and a part of the processing vessel, which defines an exhaust space U2 that is a space between the baffle plate 925 and the pumps, is referred to as an exhaust chamber EC.

In general, the inside of the processing vessel is made of aluminum and its surface is anodic oxidized (alumite treated) to enhance plasma resistance. For example, an upper wall surface PC1 and a side wall surface PC2 of the processing chamber PC shown in FIG. 9 are alumite treated. Further, the gas shower head 905a of the upper electrode 905 has an aluminum surface which has been ceramic sprayed or alumite treated. The deposit shield 915 and the baffle plate 925 have been also ceramic sprayed or alumite treated. Similarly, a wall surface EC1 of the exhaust chamber EC has been also alumite treated. A part of the exhaust chamber EC, which includes the alumite material, is greater in area than that of the processing chamber PC, which includes the alumite material.

A reaction product created during plasma processing is attached and deposited to the inner wall of the processing chamber. A deposit is peeled off and dropped from the inner wall if it is accumulated with more than a prescribed thickness. The detached deposit becomes a contaminant that may deteriorate the production yield in processing a wafer. For this reason, maintenance work, such as exchanging parts included in the deposit shield, is usually done at a predetermined time. However, at that moment, the inside of the apparatus is exposed to the atmosphere. After maintenance work, the inside of the processing vessel exposed to the atmosphere is exhausted until a desired vacuum level is achieved. A technique of shortening time taken to perform vacuum exhaust is disclosed, for example, in Japanese Patent Application Publication No. 1995-161643 and Japanese Patent Application Publication No. 1994-31154.

In the prior art, however, the entirety of the inside of the apparatus is exposed to the atmosphere during maintenance work so that the exhaust chamber EC which is not necessarily opened during maintenance as well as the processing chamber PC that performs maintenance is exposed to the atmosphere. Meanwhile, a part of the exhaust chamber EC, which includes the alumite material, is greater in area than a part of the processing chamber PC, which includes the alumite material.

According to a relationship between vacuum exhaust time and gas release ratio per unit area at room temperature as shown in FIG. 10, among alumite, sprayed ceramics, and quartz, alumite has a greater gas release amount per unit area (gas release ratio) on the order of one or two digit in comparison with the other materials when the inside of the processing vessel 100 is vacuum exhausted. Here, the main component of the released gas is moisture.

Further, alumite has a greater moisture adsorbing amount through its film surface when exposed from vacuum to the atmosphere in comparison with the other materials. FIG. 11 depicts a relationship between vacuum exhaust time and moisture adsorbing amount per unit area in a case where the processing vessel has been alumite treated, and FIG. 12 depicts a relationship between vacuum exhaust time and moisture adsorbing amount per unit area in a case where sprayed ceramics has been used for the processing vessel. Referring to FIGS. 11 and 12, alumite has a greater moisture adsorbing amount per unit area on the order of about one digit in comparison with sprayed ceramics. Over time after initiation of exposure to the atmosphere, the moisture adsorbing amount increases and it requires a long time for the moisture adsorbing amount through the film surface to be saturated and converged. The moisture adsorbing amount through the film surface is a cause of releasing gas.

Meanwhile, as described above, area of the alumite included in the exhaust chamber EC is larger than area of the alumite included in the processing chamber PC. As a consequence, the alumite included in the exhaust chamber EC, which is not necessary for exposure to the atmosphere, absorbs a considerable amount of moisture in the atmosphere, and thus it requires a long exhaust time to obtain a good vacuum exhaust property inside the processing vessel after maintenance.

FIG. 13 is a graph illustrating an example of vacuum exhaust performance after assembling the apparatus. "Chamber arrival pressure" or "build-up property (leak rate)" is an index that indicates whether a vacuum exhaust property inside the processing vessel is satisfactory. Referring to FIG. 13A, assuming a proper chamber arrival pressure is $5.0 \times 10^{-2}$ (mTorr) or less, it can be seen that eight or more hours of exhaust time are necessary. Referring to FIG. 13B, assuming that a proper build-up property (leak rate) is 1.0 (mTorr/min) or less, it can be seen that seven or more hours of exhaust time are necessary. From above, eight or more hours of exhaust time was required to satisfy both conditions, and this was one of primary causes of deteriorating productivity of the apparatus.

Moreover, the exhaust chamber EC does not include a heating means, such as a heater provided in the processing chamber PC or flow rate control valve. Accordingly, there is no means to actively control the temperature inside the exhaust chamber EC to suppress moisture in the atmosphere from being introduced into the chamber EC. Further, there is no means to accelerate gas release during vacuum exhaust, either.

SUMMARY OF THE INVENTION

In terms of the above problems, the present invention provides a plasma processing apparatus that may shorten exhaust time.

In accordance with a first aspect of the invention, there is provided a plasma processing apparatus including: a processing chamber that converts a processing gas introduced from a gas supply source into plasma and performs plasma processing on a target object; an exhaust chamber that communicates with the inside of the processing chamber to exhaust the gas converted into plasma from the processing chamber; and a blocking cover that is provided in the exhaust chamber to block communication between the inside of the processing chamber and the inside of the exhaust chamber.

In accordance with a second aspect of the invention, there is provided a maintenance method of a plasma processing apparatus including: a processing chamber that converts a processing gas introduced from a gas supply source into plasma and performs plasma processing on a target object; and an exhaust chamber that communicates with the inside of the processing chamber to exhaust the gas converted into plasma from the processing chamber, the method including: before maintenance, driving a driving mechanism, which supports and moves a blocking cover, to move the blocking cover at a position of blocking communication between the inside of the processing chamber and the inside of the exhaust chamber; and after maintenance, driving the driving mechanism to move the blocking cover at a position of not blocking communication between the inside of the processing chamber and the inside of the exhaust chamber.

In accordance with a third aspect of the invention, there is provided an assembling method of a plasma processing apparatus including: a processing chamber that converts a processing gas introduced from a gas supply source into plasma and performs plasma processing on a target object; and an exhaust chamber that communicates with the inside of the processing chamber to exhaust the gas converted into plasma from the processing chamber, the method including: before combining the processing chamber with the exhaust chamber, driving a driving mechanism, which supports and moves a blocking cover, to move the blocking cover at a position of blocking the inside of the exhaust chamber from the outside of the exhaust chamber; initiating vacuum exhaust of the exhaust chamber; combining the processing chamber with the exhaust chamber; and initiating vacuum exhaust of the processing chamber.

BRIEF DESCRIPTION OF THE DRAWINGS

The above features of the present invention will become apparent from the following description of an embodiment given in conjunction with the accompanying drawing, in which.

DETAILED DESCRIPTION OF THE EMBODIMENTS

Figure 1:
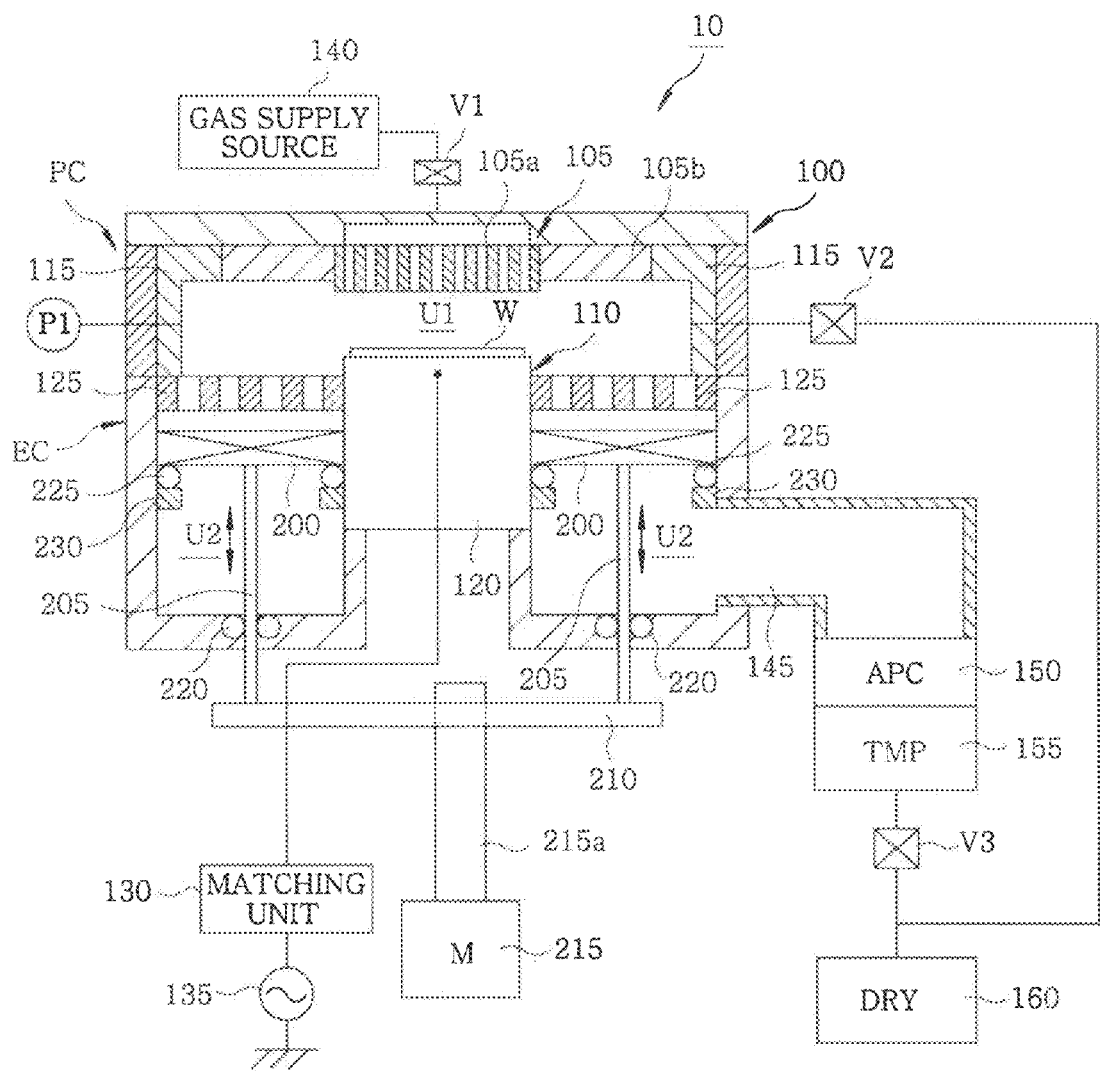
FIG. 1 is a longitudinal cross section view illustrating an etching processing apparatus according to a first embodiment of the present invention, wherein a vacuum cover is located at a position (upper side) of blocking communication between the inside of a processing chamber and the inside of an exhaust chamber.

Hereinafter, embodiments of the present invention will be described in greater detail with reference to accompanying drawings where like reference numerals refer to like elements so that repetitive descriptions are omitted.

First Embodiment

Construction of Overall Apparatus

First of all, a construction of an overall plasma processing apparatus with electrodes according to an embodiment of the present invention will be described with reference to FIG. 1. FIG. 1 is a longitudinal cross section view schematically illustrating an etching processing apparatus (parallel plate type plasma processing apparatus) according to an embodiment of the present invention. The etching processing apparatus 10 is an example of a plasma processing apparatus that generates plasma using electromagnetic wave energy to perform plasma processing on a wafer W.

The etching processing apparatus 10 includes a processing vessel 100 that performs plasma processing on the wafer W. The processing vessel 100 is cylindrical and includes an upper electrode 105 and a lower electrode 110 that faces the upper electrode 105. The upper electrode 105 includes a gas shower header 105a and a quartz shield 105b that is surrounded by a deposit shield 115.

A susceptor 120 is provided at the center of the processing vessel to mount the wafer W. A baffle plate 125 is arranged at the periphery of the susceptor 120 to control the flow of gas. The susceptor 120 is connected to a high frequency power supply 135 via a matching unit 130. A gas supplied from a gas supply source 140 is introduced from the upper electrode 105a into the processing vessel 100, with the flow rate controlled by a gas inlet valve V1, and decomposed by high frequency electric field energy supplied from the high frequency power supply 135. Accordingly, plasma is generated between the upper electrode 105 and the lower electrode 110 and an etching process is performed on the wafer W using the generated plasma.

In the processing vessel 100, a space of a processing chamber PC, which is partitioned by the baffle plate 125 and located over the susceptor 120, is referred to as "processing space U1" and a space of an exhaust chamber EC, which is located between the baffle plate 125 and a TMP 155, is referred to as "exhaust space U2".

In the exhaust space U2, an exhaust port 145 is arranged and the exhaust port 145 communicates with an APC 150 and the TMP 155. A DRY 160 is arranged at the rear side of the TMP 155. Rough exhaust valves V2 and V3 are open so that the inside of the processing vessel 100 is roughly exhausted by the DRY 160, and then closed. Then, while opening degree of the APC 150 is controlled depending on the pressure inside the processing vessel 100, and the inside of the processing vessel 100 is vacuum exhausted by the TMP 155.

(Construction of Vacuum Cover)

A vacuum cover 200 is provided under the baffle plate 125 to maintain vacuum state in the exhaust space U2. The vacuum cover 200 is made of metal, such as aluminum, and alumite treated. The vacuum cover 200 may be made of a dielectric material. The vacuum cover 200 is an example of a blocking cover that blocks communication between the inside of the processing chamber PC and the inside of the exhaust chamber EC.

One end of a supporting rod 205 is connected to a central bottom portion of the vacuum cover 200. The other end of the supporting rod 205 passes through the processing vessel 100 and connects to a supporting table 210, so that the vacuum cover 200 is supported by the supporting table 210. The portion penetrated by the supporting rod 205 is sealed by a vacuum seal 220 to maintain airtightness inside the processing vessel 100. The supporting table 210 is connected to a motor 215.

A motor shaft 215a of the motor 215 is engaged with the supporting table 210, for example, by a ball screw mechanism. The rotation of the motor 215 causes the supporting table 210 to move up and down, so that the vacuum cover 200 may vertically move in the exhaust space U2.

Further, the supporting rod 205, the supporting table 210, and the motor 215 support the vacuum cover 200 and are an example of a driving mechanism that vertically moves the vacuum cover 200. Various types of driving mechanisms may be considered, such as an air driving mechanism, a hydraulic driving mechanism, or the like.

Figure 4:
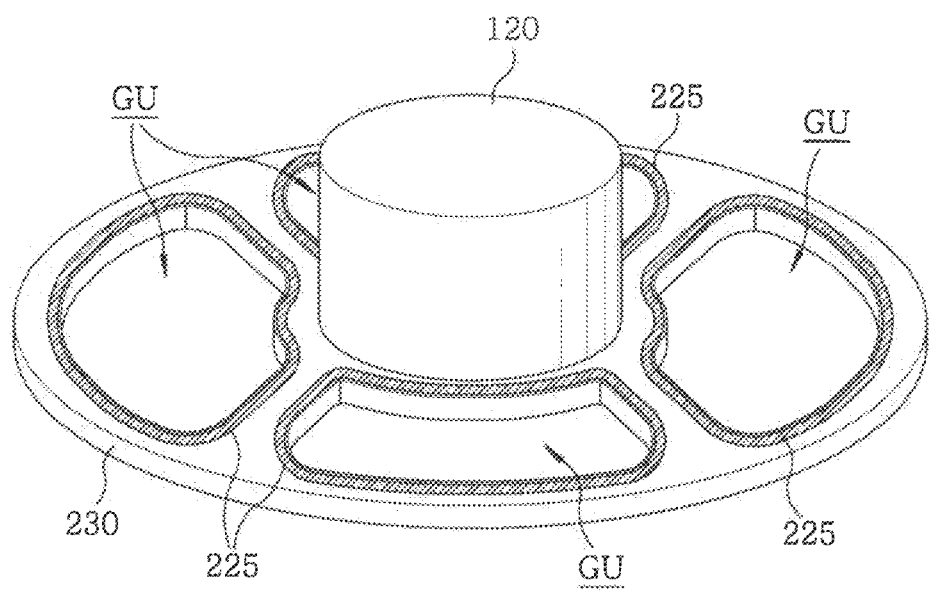
FIG. 4 is a seal gate ring included in the etching processing apparatus according to the first embodiment of the present invention.

A seal gate ring 230 is provided between the outer peripheral surface and the inner wall surface of the exhaust chamber EC. As shown in FIG. 4, the seal gate ring 230 includes four seal gate spaces GU. The vacuum cover 200 may pass through the seal gate space GU. Although it is described four seal gate spaces GU are provided, the present invention is not limited thereto. For example, one seal gate space GU, or two or more seal gate spaces GU may be provided in the form of a ring around the susceptor 120.

A vacuum seal 225 is provided along the periphery of the seal gate space GU. The vacuum seal 225 seals between the vacuum cover 200 and the seal gate ring 230 when the vacuum cover 200 is arranged over the seal gate ring 230. An O-shaped ring may be used as the vacuum seal 225.

(Operation of Vacuum Cover)

Figure 2:
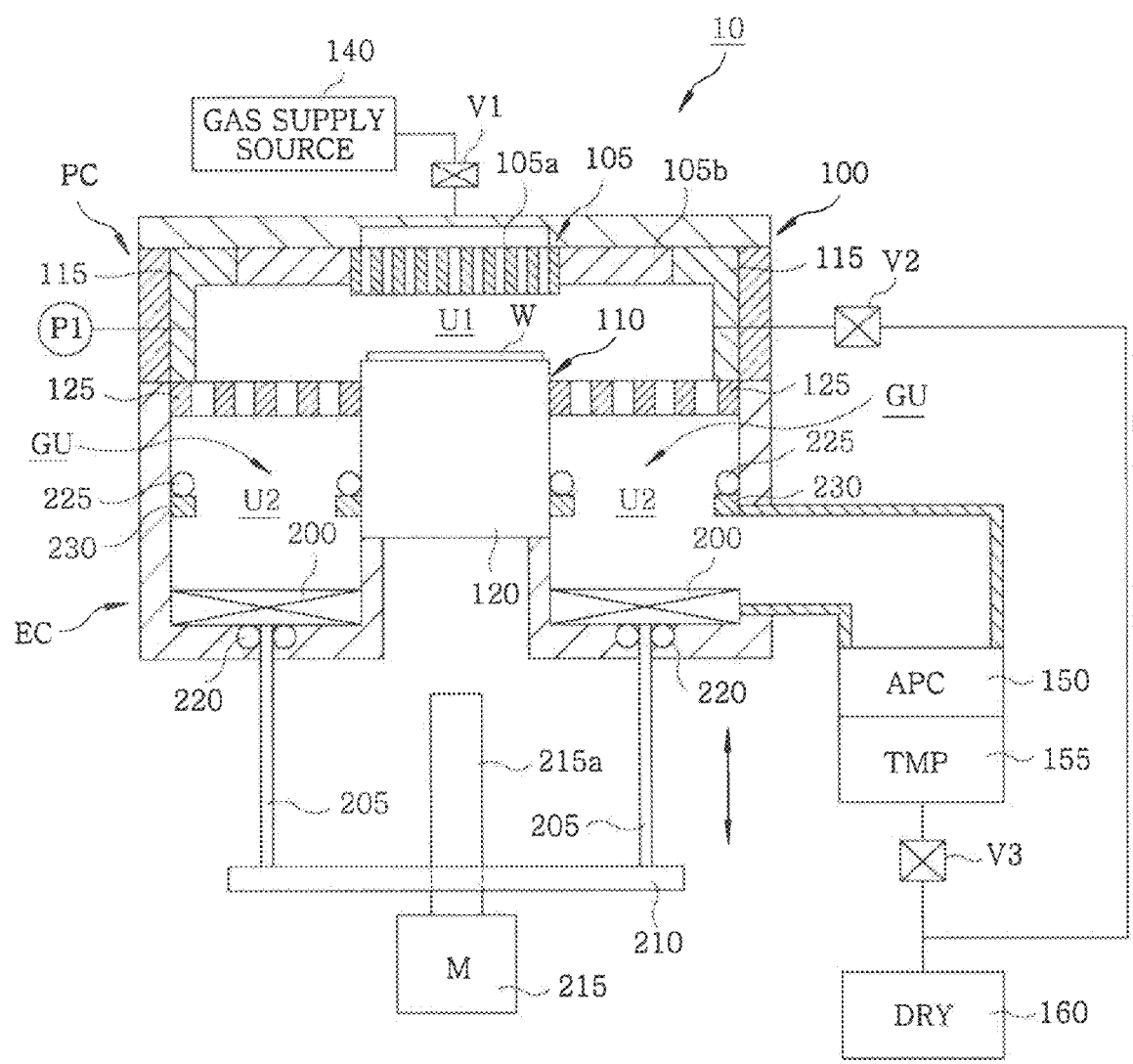
FIG. 2 is a longitudinal cross section view illustrating the etching processing apparatus according to the first embodiment of the present invention, wherein the vacuum cover is located at a position (lower side) of allowing communication between the inside of a processing chamber and the inside of an exhaust chamber.

In general, when a wafer is processed, the vacuum cover 200 is positioned near the underside, bottom surface of the exhaust chamber EC as shown in FIG. 2. When the processing chamber PC is subjected to maintenance, the vacuum cover 200 moves below the baffle plate 125.

Figure 3:
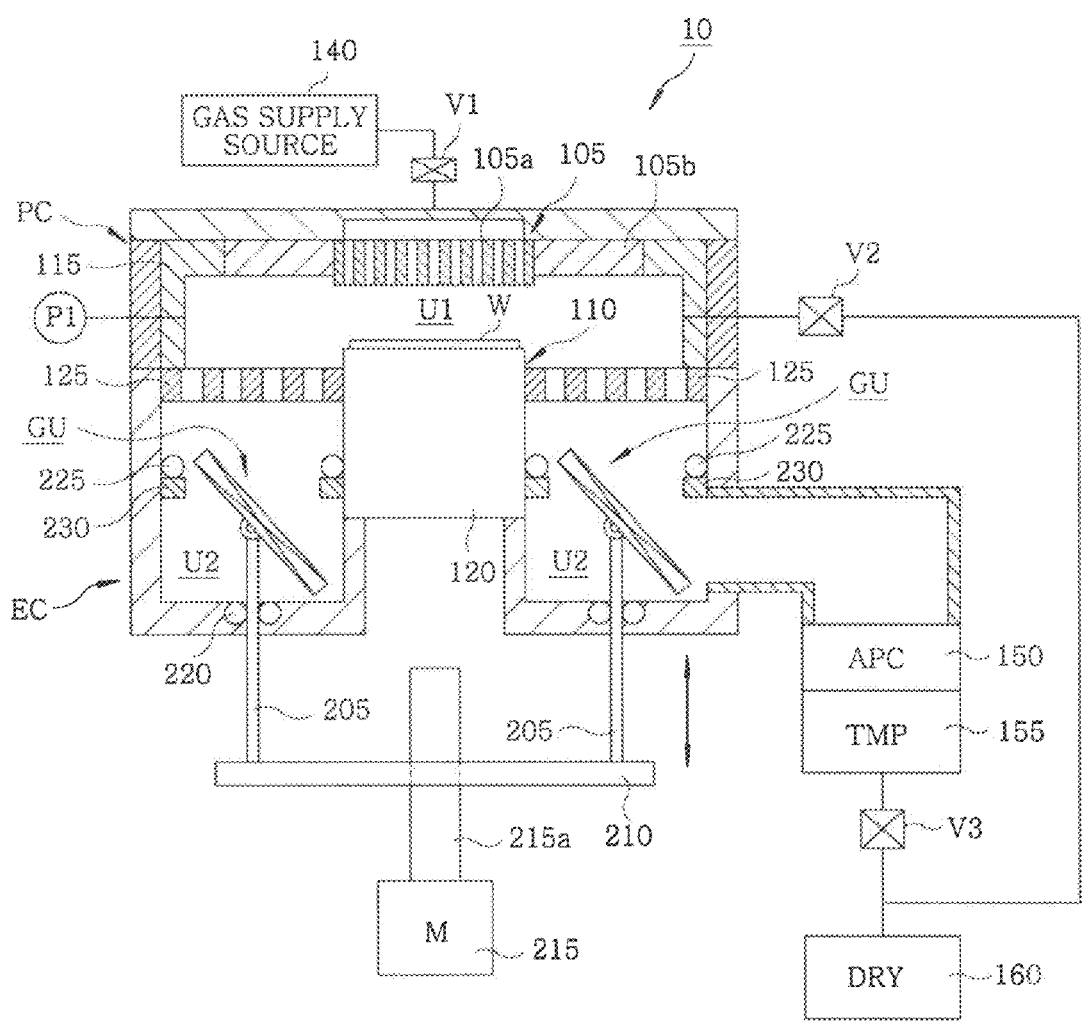
FIG. 3 is a longitudinal cross section view illustrating the etching processing apparatus according to the first embodiment of the present invention, wherein the vacuum cover is on the move.

To move the vacuum cover 200 below the baffle plate 125, for example, as shown in FIG. 3, the driving force from the motor 215 is transferred to the vacuum cover 200 via the supporting rod 205 to elevate the supporting rod 205. Then, the vacuum cover 200 moves through the seal gate space GU provided in the exhaust chamber EC, with the vacuum cover 200 obliquely inclined.

The vacuum cover 200, which has passed through the seal gate space GU, returns to its original parallel state as shown in FIG. 1, and then mounts on the seal gate ring 230. By doing so, upper and lower spaces of the seal gate ring 230 are partitioned by the vacuum cover 200. The vacuum seal 225 is provided between the seal gate ring 230 and the vacuum cover 200 to seal the seal gate space GU, so that the exhaust space U2 may maintain airtightness.

The vacuum seal 225 is not necessarily mounted at the side of the seal gate ring 230. For example, the vacuum seal 225 may be mounted at a lower portion of the vacuum cover 200. By doing so, the vacuum seal 225 may be positioned between the seal gate ring 230 and the vacuum cover 200 to maintain airtightness of the exhaust space U2.

Figure 5:
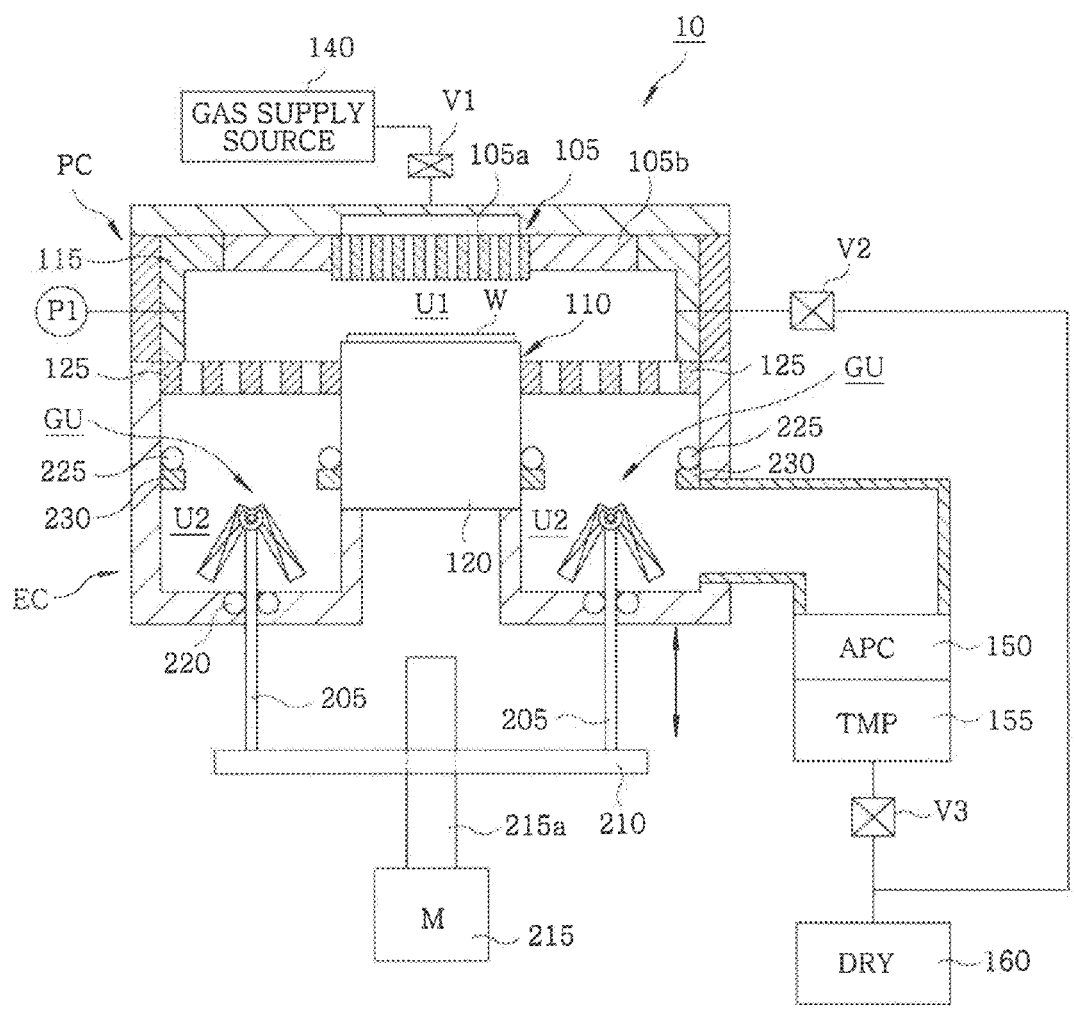
FIG. 5 is another longitudinal cross section view illustrating the etching processing apparatus according to the first embodiment of the present invention, wherein the vacuum cover is on the move.

Further, while going through the seal gate space GU, the vacuum cover 200 may be folded as shown in FIG. 5 other than obliquely inclined as shown in FIG. 3.

(Maintenance Operation)

Next, the maintenance operation will be described. First, while the vacuum cover 200 is positioned at the bottom surface of the exhaust chamber EC as shown in FIG. 2, the processing chamber PC, the exhaust chamber EC, and the APC 150 are exhausted to have a desired vacuum state, and then the wafer is processed.

When maintenance is required after the wafer is processed, as shown in FIG. 3, the vacuum cover 200 is moved from the underside of the exhaust chamber EC to the baffle plate 125 so that the vacuum cover 200 is fixed on the seal gate ring 230 as shown in FIG. 1. Accordingly, the exhaust space U2 between the bottom surface of the vacuum cover 200 and the APC 150 is maintained at the vacuum exhausted state. Under this state, a purge gas, such as $N_2$, is introduced into the wafer processing space U1 of the processing chamber PC and the pressure inside the wafer processing space U1 is raised up to atmospheric pressure so that only the processing chamber PC is open to the atmosphere. Under this situation, maintenance is performed. The pressure inside the wafer processing space U1 is measured by a pressure gauge P1 that is provided in the processing chamber PC.

After the maintenance (for example, exchange of the deposit shield) is ended, the rough exhaust valve V3 is closed. Then, the rough exhaust valve V2 is opened and the wafer processing space U1 is vacuum exhausted by using the DRY 160. When the pressure inside the processing space U1 reaches, for example, 0.1 Torr or less, the rough exhaust valve V2 is closed and the rough exhaust valve V3 is opened to continue exhaust. And, the vacuum cover 200 fixed on the baffle plate 125 moves to a lower portion of the exhaust chamber EC as shown in FIG. 2 and the wafer processing space U1, the exhaust space U2, and the APC 150 are vacuum exhausted by using the TMP 155.

Figure 13A:
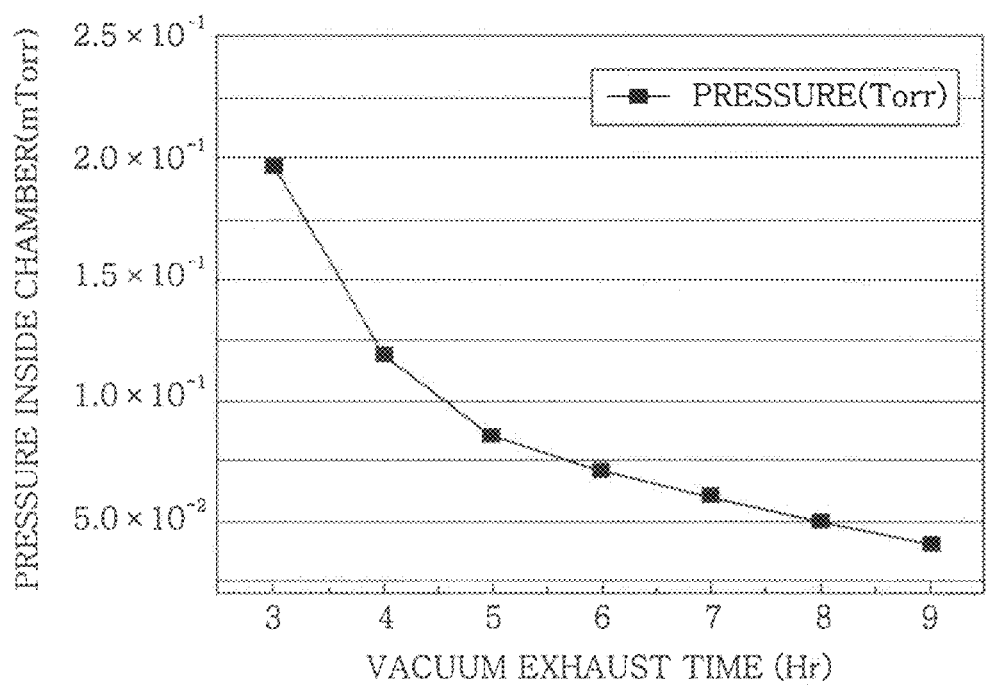
FIG. 13A is a graph illustrating a relationship between vacuum exhaust time and pressure inside chamber.
Figure 13B:
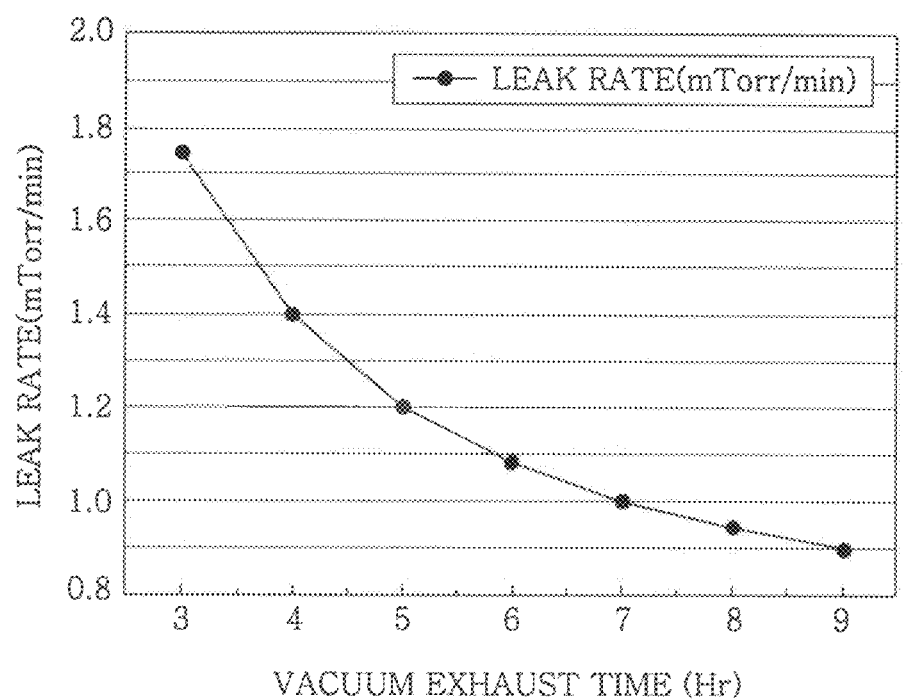
FIG. 13B is a graph illustrating a relationship between vacuum exhaust time and leak rate.

As mentioned above, the area of the alumite treated surface of the exhaust chamber EC is about 1.0 times to 1.5 times that of the processing chamber PC. Accordingly, when the exhaust space U2 is exposed to atmosphere during maintenance, alumite material may absorb a considerable amount of moisture in the atmosphere while the maintenance is performed. As a result, it requires a long exhaust time to have a good vacuum exhaust property in the processing vessel after maintenance. For example, assuming that an appropriate arrival pressure value is $5.0 \times 10^{-2}$ (mTorr) or less, it requires an exhaust time of eight or more hours as shown in FIG. 13A. Assuming that an appropriate build-up property (leak rate) value is 1.0 (mTorr/min) or less, it requires an exhaust time of seven or more hours.

In the etching processing apparatus 10 according to the embodiment, however, the wafer processing space U1 and the exhaust space U2 are partitioned from each other by the vacuum cover 200 during maintenance and communication between the chambers is blocked. Accordingly, during maintenance, only the processing chamber PC is open to the atmosphere and the exhaust chamber EC maintains a vacuum state. Consequently, the alumite included in the exhaust chamber EC does not absorb moisture in the atmosphere during maintenance, and this may shorten vacuum exhaust time after maintenance. For instance, the area of the alumite treated surface of the exhaust chamber EC is equal to or about 1.5 times of the area of the alumite treated surface of the processing chamber PC, the exhaust time after maintenance may be shortened down to four hours or less. As a consequence, productivity of the apparatus may be sharply raised.

Second Embodiment

An etching processing apparatus 10 according to a second embodiment of the present invention will now be described with reference to FIG. 6. The etching processing apparatus 10 according to the second embodiment is different from the etching processing apparatus according to the first embodiment in location of the cover. Hereinafter, the descriptions will focus on the difference, and descriptions on parts identical to the first embodiment will be omitted.

(Operation of Seal-Off Cover)

Figure 6:
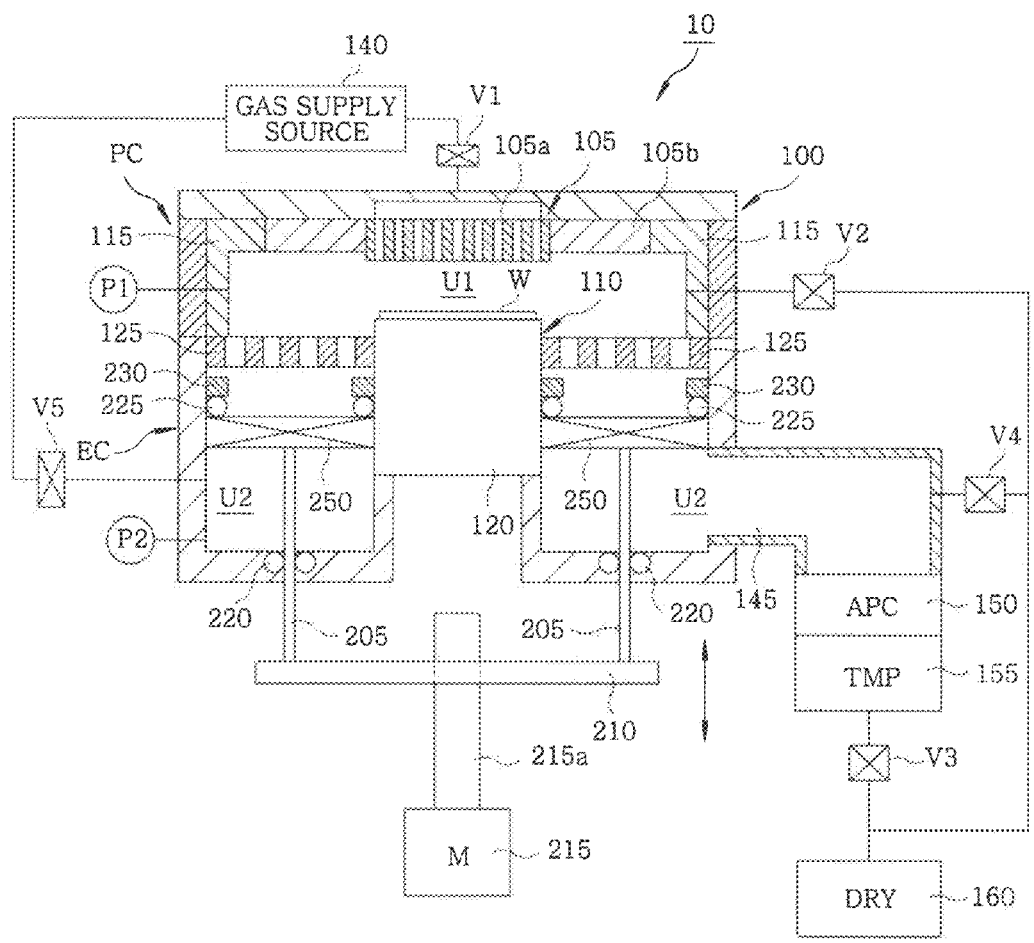
FIG. 6 is a longitudinal cross section view illustrating an etching processing apparatus according to a second embodiment of the present invention, wherein a gas seal-off cover is located at a position (upper side) of blocking communication between the inside of a processing chamber and the inside of an exhaust chamber.

In the etching processing apparatus 10 according to the embodiment, as shown in FIG. 6, a gas seal-off cover 250 is arranged under the seal gate ring 230 and below the baffle plate 125. The gas seal-off cover 250 is an example of a blocking cover that blocks communication between the inside of the processing chamber PC and the inside of the exhaust chamber EC.

Figure 7:
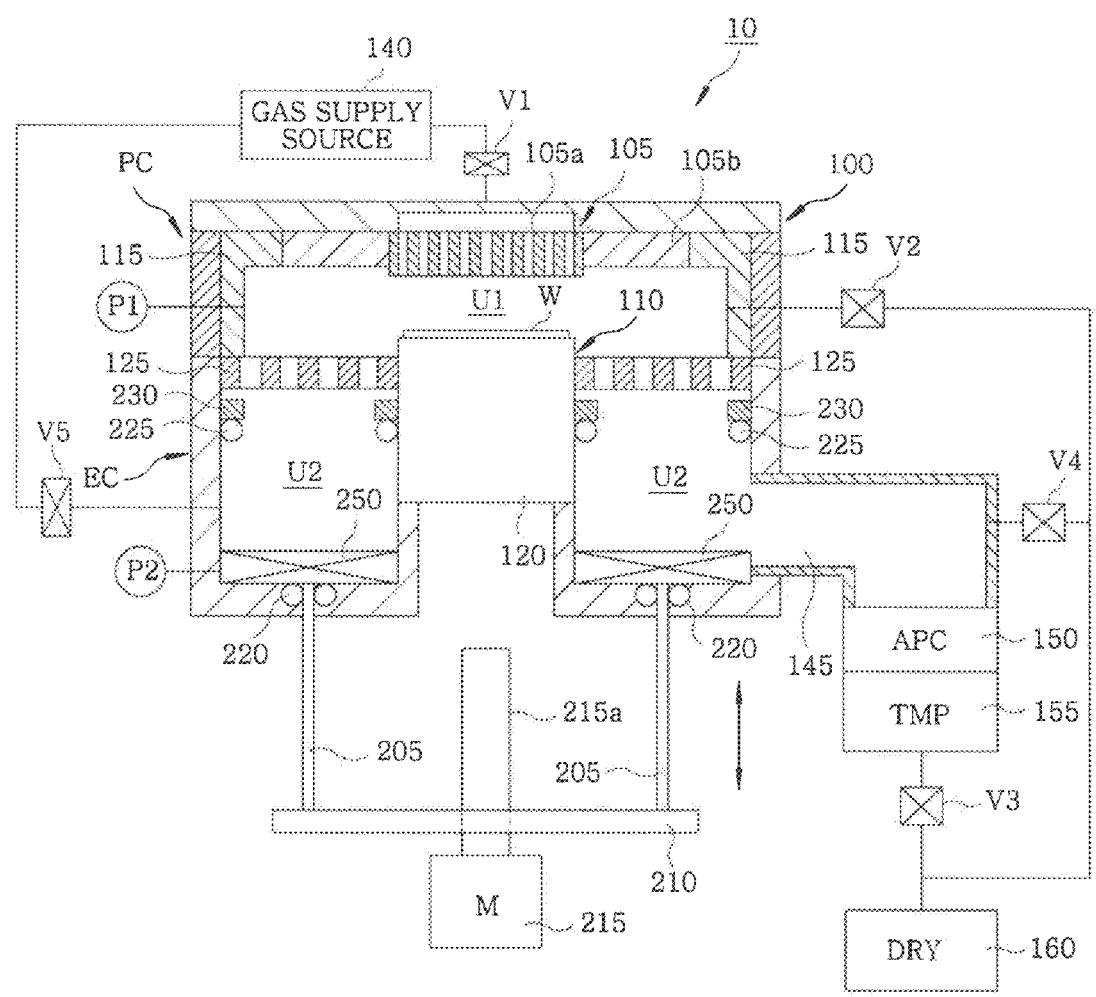
FIG. 7 is a longitudinal cross section view illustrating the etching processing apparatus according to the second embodiment of the present invention, wherein a gas seal-off cover is located at a position (lower side) of allowing communication between the inside of a processing chamber and the inside of an exhaust chamber.

The exhaust space U2 from the gas seal-off cover 250 to the APC 150 is maintained to a predetermined pressure of gas atmosphere by the gas seal-off cover 250 and it is avoided of atmosphere to be introduced into the exhaust space U2. A pressure gauge P2 is provided at the side of the exhaust chamber EC to maintain a predetermined pressure. Generally, while processing wafer, the gas seal-off cover 250 is, for example, arranged near the underside, bottom surface of the exhaust chamber EC as shown in FIG. 7.

The following two methods A and B will now be described as an order of exposing the processing chamber PC to the atmosphere during maintenance.

(Initiation Order A of Maintenance)

First, an order A of exposing the processing chamber PC to the atmosphere during maintenance will be described. While processing wafer, the gas seal-off cover 250 is positioned near the underside, bottom surface of the exhaust chamber EC as shown in FIG. 7. The rough exhaust valves V2, V3, and V4 are opened and the inside of the processing vessel 100 is roughly exhausted by the DRY 160. Then, the rough exhaust valves V2, V3, and V4 are closed and the inside of the processing vessel 100 is vacuum exhausted by the TMP 155 with the opening degree of the APC 150 controlled depending on the pressure inside the processing vessel 100.

When performing maintenance of the processing chamber PC, spaces U1 and U2 from the processing chamber PC to the APC 150 via the exhaust chamber EC are vacuum exhausted while the gas seal-off cover 250 is moved from the underside of the exhaust chamber EC to beneath the vacuum seal 225 under the baffle plate 125 as shown in FIG. 6.

The APC 150 is closed and the gas inlet valves V1 and V5 are opened. Then, a gas, such as $N_2$, is introduced in the wafer processing space U1, which is located over the gas seal-off cover 250, and the exhaust space U2, which is located under the gas seal-off cover 250, and the pressure therein is raised. In this case, the amount of gas introduced is adjusted so that the pressure inside the space U2 located under the gas seal-off cover 250 is not lower than the pressure inside the space U1 located over the gas seal-off cover 250. Thereafter, at the time that the space U1 located over the cover reaches the atmospheric pressure (=1 atmosphere) and the space U2 located under the cover reaches, for example, 1.2 atmospheres, only the processing chamber PC is opened to the atmosphere.

(Initiation Order B of Maintenance)

Next, an order B of exposing the processing chamber PC to the atmosphere during maintenance will be described. As shown in FIG. 7, the gas seal-off cover 250 is positioned near the underside, bottom surface of the exhaust chamber EC and the spaces U1 and U2 from the processing chamber PC via the exhaust chamber EC to the APC 150 are vacuum exhausted. And then the APC 150 is closed.

The gas inlet valves V1 and V5 are opened to introduce a gas, such as N2, into the spaces U1 and U2 from the processing chamber PC via the exhaust chamber EC to the APC 150, and the pressure therein is raised. Thereafter, prior to the time that the pressure inside the spaces U1 and U2 nearly reaches the atmospheric pressure, the gas seal-off cover 250 is moved from the underside of the exhaust chamber EC to under the baffle plate 125 as shown in FIG. 6. Then, at the time that the space U1 located over the gas seal-off cover 250 reaches the atmospheric pressure (i.e., 1 atmosphere) and the space U2 located under the gas seal-off cover 250 reaches, e.g., 1.2 atmospheres, the processing chamber PC is only opened to the atmosphere.

In either method as above, the exhaust space U2 at the side of the exhaust chamber EC is not opened to the atmosphere and alumite does not absorb moisture in the atmosphere during maintenance. Accordingly, it can be possible not only to shorten time required for vacuum exhaust after exposing the etching processing apparatus 10 to the atmosphere due to maintenance, but also to sharply enhance productivity of the apparatus.

Further, in this embodiment, it is not necessary to incline or fold the gas seal-off cover 250 to pass through the seal gate space GU. Thus, it can be possible to simplify construction of the gas seal-off cover 250 and facilitate the control of the gas seal-off cover 250.

(Order of Vacuum Exhaust After Maintenance)

After maintenance is ended, vacuum exhaust is performed as the next order. To begin with, the rough exhaust valve V3 is closed and the rough exhaust valve V2 is opened, and then the wafer processing space U1 is vacuum exhausted by using the DRY 160.

Subsequently, the rough exhaust valve V4 is opened to vacuum exhaust the space U2 from the gas seal-off cover 250 to the APC 150. In this case, the pressure inside the processing space U1 is controlled by the pressure gauges P1 and P2 and the rough exhaust valves V2 and V4 so that the pressure inside the processing space U1 is not higher than the pressure inside the exhaust space U2.

When the pressure inside the wafer processing space U1 reaches, for example, less than 0.1 Torr and the pressure inside the exhaust space U2 reaches 0.1 Torr to 0.2 Torr, the rough exhaust valves V2 and V4 are closed and the rough exhaust valve V3 is opened. Further, the gas seal-off cover 250 fixed under the baffle plate 125 is moved to the bottom surface of the exhaust chamber EC and from the wafer processing space U1 to the exhaust space U2 including the APC 150 is vacuum exhausted by the TMP 155 as shown in FIG. 7.

Third Embodiment

Next, an etching processing apparatus according to a third embodiment of the present invention will be described with reference to FIG. 8. The etching processing apparatus 10 according to the third embodiment differs from the etching processing apparatus 10 according to the first embodiment in that a temperature control mechanism 300 is provided at the exhaust chamber EC. Hereinafter, the descriptions will focus on the difference and repetitive descriptions on parts equal to those in the first embodiment will be omitted.

(Temperature Control of Exhaust Chamber)

Figure 8:
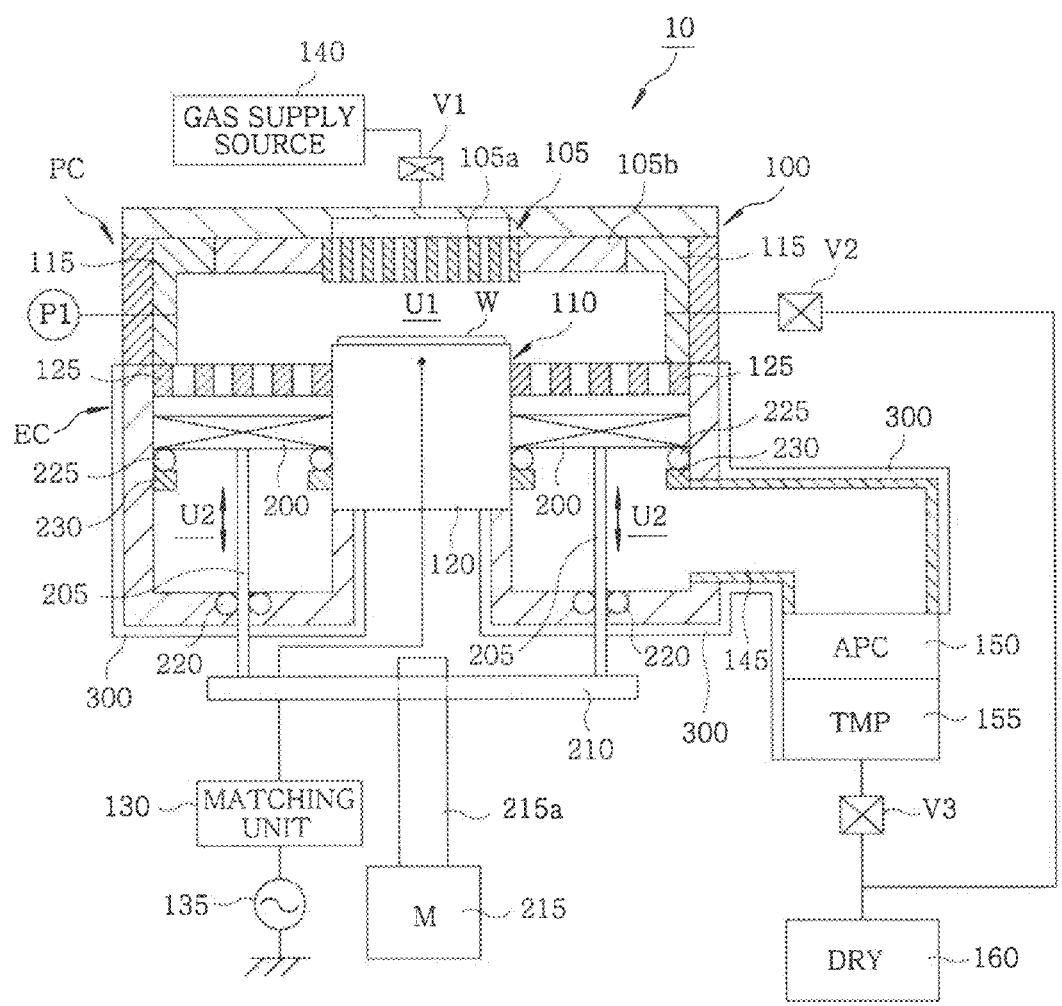
FIG. 8 is a longitudinal cross section view illustrating an etching processing apparatus according to a third embodiment of the present invention.
Figure 9:
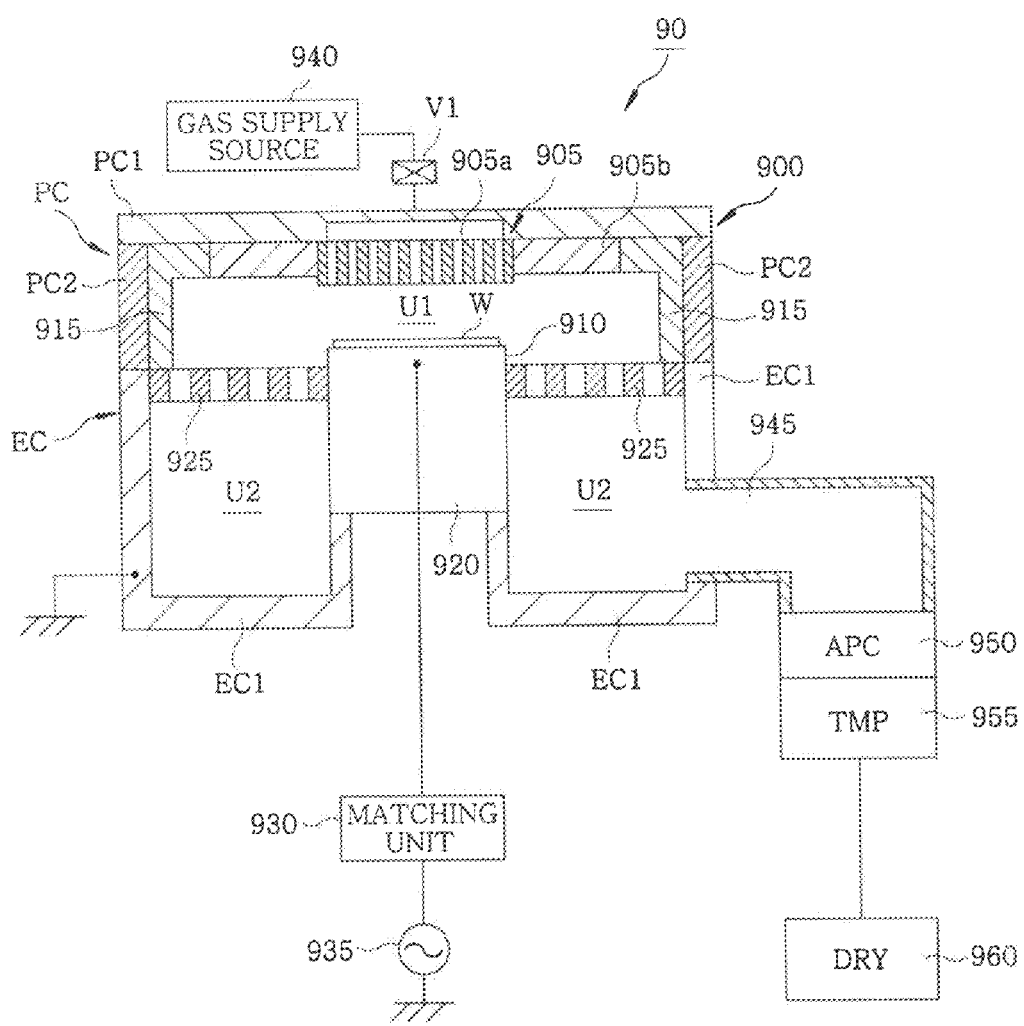
FIG. 9 is a longitudinal cross section view illustrating an etching processing apparatus according to a prior art.
Figure 10:
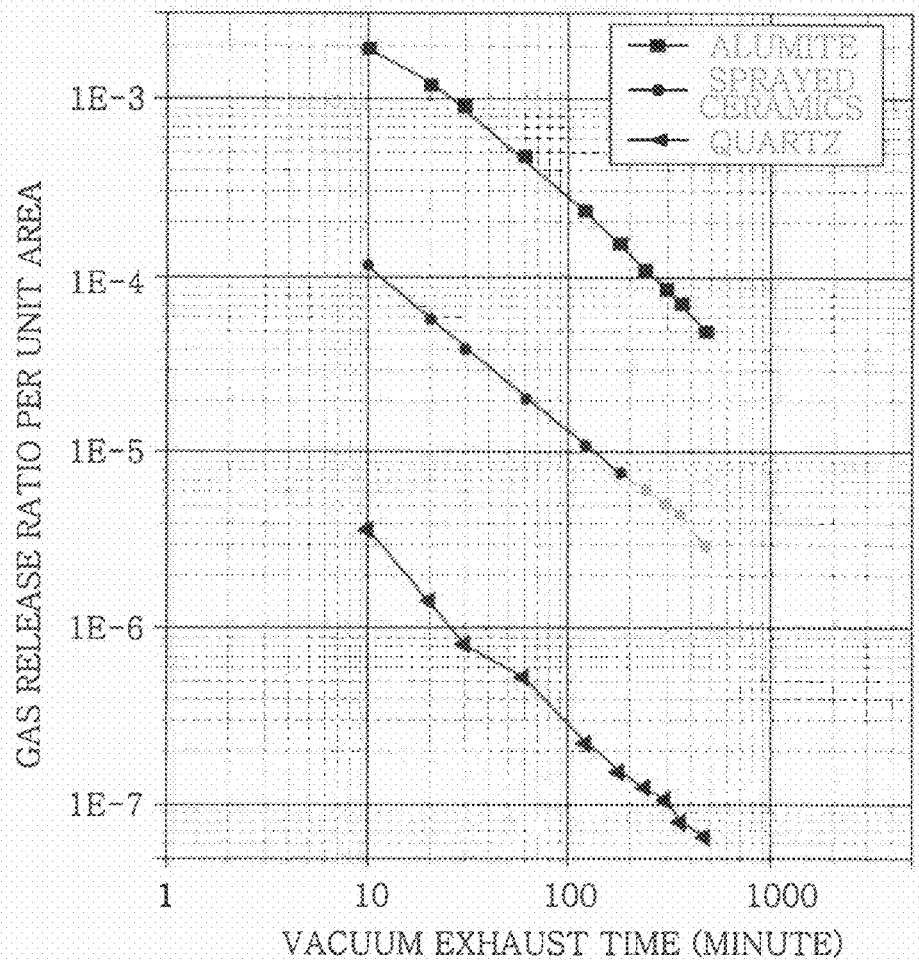
FIG. 10 is a graph illustrating a general relationship between vacuum exhaust time and gas release ratio per unit area.
Figure 11:
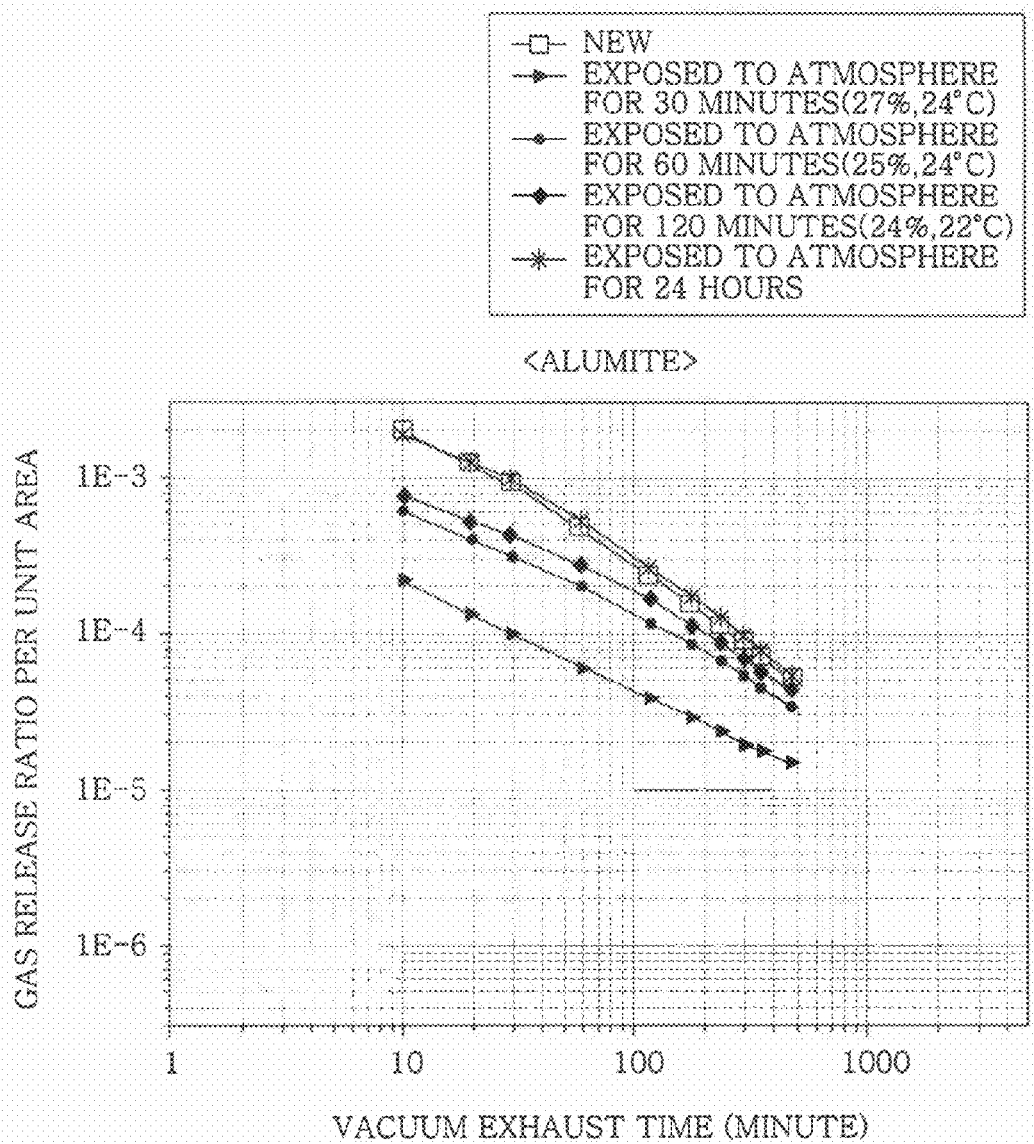
FIG. 11 is a graph illustrating a general relationship between vacuum exhaust time and moisture adsorbing amount per unit area for alumite.
Figure 12:
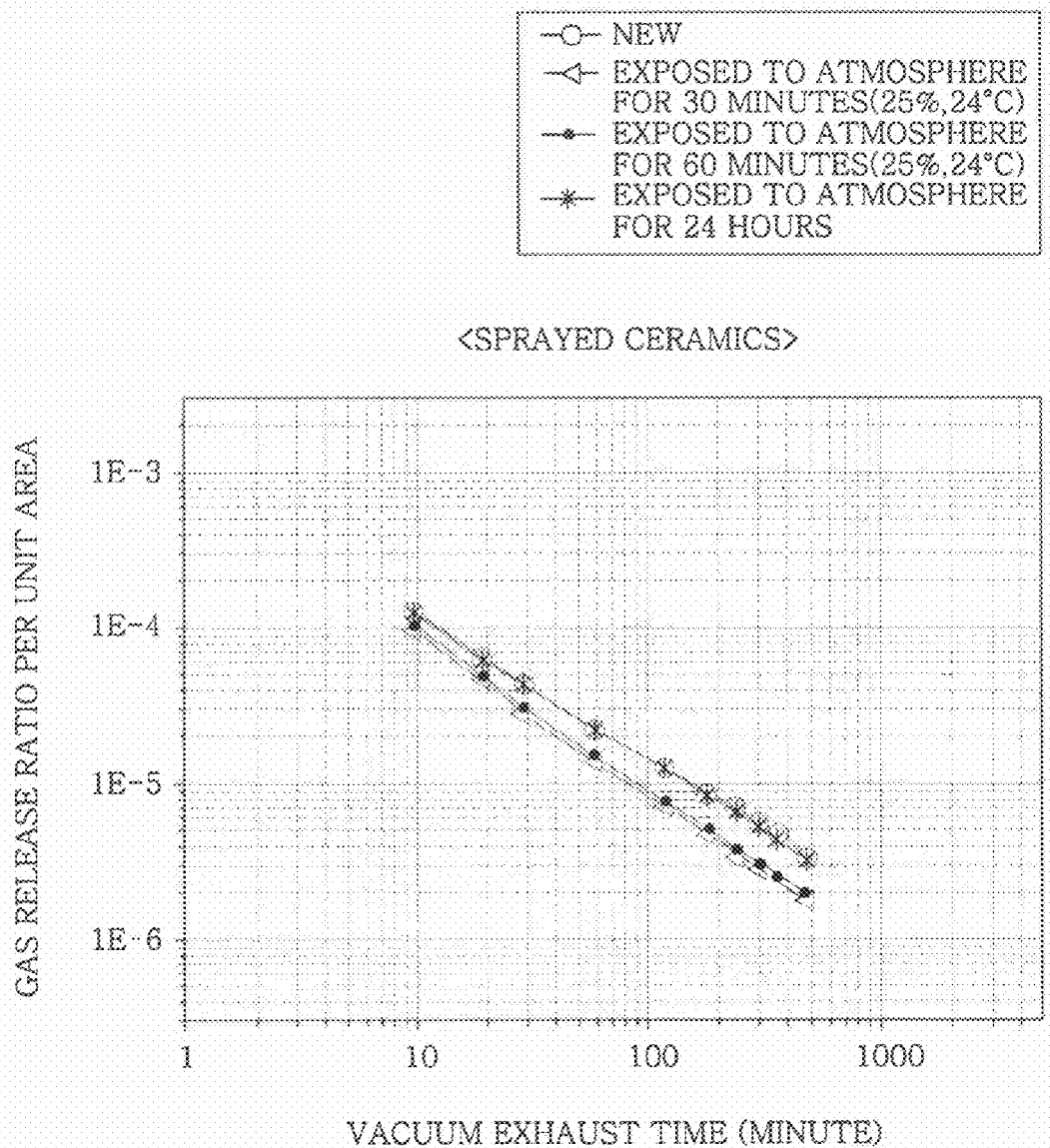
FIG. 12 is a graph illustrating a general relationship between vacuum exhaust time and moisture adsorbing amount per unit area for sprayed ceramics.

The etching processing apparatus 10 shown in FIG. 8 includes the temperature control mechanism 300 at an outer wall of the exhaust chamber EC in addition to the construction of the etching processing apparatus 10 shown in FIG. 1. The temperature control mechanism 300 includes a heating mechanism and a cooling mechanism. In the temperature control of the exhaust chamber EC, the temperature of the exhaust chamber EC is raised by the heating mechanism of the temperature control mechanism 300, for example, to 80° C. that is set by a heating mechanism (not shown) provided in the wafer processing chamber PC. Accordingly, it can be possible to more certainly suppress adsorption of moisture to the exhaust chamber EC when the processing chamber PC is exposed to the atmosphere. Further, when a few tens of minutes to approximately one hour passed after vacuum exhaust is initiated by the DRY 160 and then exhaust is performed by the TMP 155, the temperature of the exhaust chamber EC is lowered from 80° C. to, e.g. 40° C. Accordingly, arrival pressure or leak rate in the overall apparatus may be enhanced.

The etching processing apparatus 10 employing the gas seal-off cover 250 shown in FIG. 6 instead of the vacuum cover 200 shown in FIG. 2 may also include the temperature control mechanism 300 in the exhaust chamber EC shown in FIG. 6. In this case, while the wafer processing space U1 starts to be exhausted by the TMP 155 after its rough exhaust, the temperature of the exhaust chamber EC may be raised from the current temperature, e.g., about 40° C. to 80° C. by forced heating of the temperature control mechanism 300 when moisture from the wafer processing space U1 exposed to the atmosphere is adsorbed to the inner wall surface of the exhaust chamber EC, thus making it possible to suppress adsorption of moisture to the exhaust chamber EC. By adding the temperature control mechanism 300 to the exhaust chamber EC, it may be possible to effectively shorten the time required for vacuum exhaust and raise productivity of the apparatus.

Fourth Embodiment

Exhaust Order of Manufacture and Examination Process

Upon Assembling and Examining the Chamber

An efficient exhaust order in a manufacture and examination process will be described according to a fourth embodiment. In assembling the etching processing apparatus 10, vacuum exhaust is previously initiated with the vacuum cover 200 moved at the blocking position as shown in FIG. 1, at the stage prior to completely assembling the overall components, i.e., at the time that the exhaust chamber EC, the APC 150, and the TMP 155 are combined.

Furthermore, the temperature of the exhaust chamber EC is set, e.g., 80° C. by the temperature control mechanism 300. By doing so, vacuum degassing of the exhaust chamber EC is accelerated. Thereafter, at the time that the exhaust chamber EC is combined with the processing chamber PC, the processing chamber PC starts to be vacuum exhausted.

A method of assembling the etching processing apparatus 10 according to this embodiment, wherein the exhaust chamber is previously vacuum exhausted prior to assembling the entire components, may shorten the exhaust time required to achieve a predetermined vacuum degree in comparison with a case where vacuum exhaust is initiated only after completely assembling the overall components including the processing chamber PC.

Furthermore, while the exhaust chamber EC, the APC 150, and the TMP 155 are assembled and the vacuum cover 200 is moved at the blocking position as shown in FIG. 1, the exhaust chamber EC is vacuum exhausted, and then, in the state as shown in FIG. 6, a gas, such as $N_2$, is introduced into the exhaust chamber EC. Under this situation, the exhaust chamber is sealed off to have the pressure of 1 atmosphere or more. By doing so, introduction of atmosphere into the exhaust chamber EC may be suppressed.

As mentioned above, the exhaust chamber may be previously vacuum exhausted and sealed off to have the pressure of 1 atmosphere or more with $N_2$ gas or the like so as to shorten the exhaust time required to have a predetermined vacuum degree, thus resulting in further reduced exhaust time than a case of initiating vacuum exhaust after the overall components including the wafer processing chamber have been assembled in order to have the predetermined vacuum degree.

Further, the gas seal-off cover 250 may be replaced by the vacuum cover 200, and the vacuum exhaust may be previously initiated with the vacuum cover 200 moved at the blocking position as shown in FIG. 6.

According to the above embodiments, it can be possible to avoid exposure of the exhaust chamber EC to the atmosphere by the blocking cover, such as the vacuum cover 200 or the gas seal-off cover 250, thus shortening the vacuum exhaust time. In addition, it can be possible to suppress introduction of moisture from the atmosphere into the exhaust chamber EC by controlling the temperature inside the exhaust chamber EC through the heating means provided in the exhaust chamber EC. Further, it can be possible to reduce the vacuum exhaust time during production and examination of the etching processing apparatus.

While the invention has been shown and described with respect to the embodiments, it will be understood by those skilled in the art that various changes and modification may be made without departing from the scope of the invention as defined in the following claims.

For example, the vacuum cover or the gas seal-off cover is placed under the baffle plate. Alternately, the vacuum cover or the gas seal-off cover may be brought in tight contact with the baffle plate directly under the baffle plate. A space between the cover and the baffle plate is opened to the atmosphere during maintenance, and thus alumite material exposed therethrough may absorb moisture. Accordingly, the smaller this space is, the smaller amount of moisture the alumite absorbs, so that smaller space may lead to further reduced exhaust time.

Further, the plasma processing apparatus is not limited to the capacitively coupled plasma processing apparatus (parallel-plate type plasma processing apparatus). For example, inductively coupled plasma processing apparatus, microwave plasma processing apparatus, or any other types of plasma processing apparatuses may be employed.

Further, the target object subjected to plasma processing in the plasma processing apparatus may be a wafer or a substrate.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a processing chamber that converts a processing gas introduced from a gas supply source into plasma and performs plasma processing on a target object;
an exhaust chamber that communicates with the inside of the processing chamber to exhaust a gas converted into plasma from the processing chamber;
a blocking cover that is provided in the exhaust chamber to block communication between the inside of the processing chamber and the inside of the exhaust chamber;
a driving mechanism that supports and vertically moves the blocking cover, and wherein the driving mechanism moves the blocking cover vertically between an open position and a closed position, and wherein in said closed position the blocking cover closes and blocks gas flow from the processing chamber to the exhaust chamber, and wherein in the open position gas flow is allowed from the processing chamber to the exhaust chamber; and
a seal member having at least one opening therethrough, and wherein the blocking cover contacts the seal member and closes said at least one opening in the closed position,
wherein the seal member includes a plurality of openings therethrough, and wherein a plurality of blocking covers are provided, and further wherein each of the blocking covers moves between open and closed positions, and wherein each blocking cover closes and blocks a respective one of the plurality of openings in the closed position.

2. A plasma processing apparatus comprising:
a processing chamber that converts a processing gas introduced from a gas supply source into plasma and performs plasma processing on a target object;
an exhaust chamber that communicates with the inside of the processing chamber to exhaust a gas converted into plasma from the processing chamber;
a blocking cover that is provided in the exhaust chamber to block communication between the inside of the processing chamber and the inside of the exhaust chamber;
a driving mechanism that supports and vertically moves the blocking cover, and wherein the driving mechanism moves the blocking cover vertically between an open position and a closed position, and wherein in said closed position the blocking cover closes and blocks gas flow from the processing chamber to the exhaust chamber, and wherein in the open position gas flow is allowed from the processing chamber to the exhaust chamber;
a baffle plate having a plurality of openings therethrough, and wherein the baffle plate is positioned such that gas flows from the processing chamber through the plurality of openings of the baffle plate and to the exhaust chamber when the blocking cover is in the open position, the baffle plate being configured to control the gas flow from the processing chamber to the exhaust chamber; and
a seal member having at least one opening therethrough, and wherein the blocking cover contacts the seal member and closes said at least one opening in the closed position,
wherein the blocking cover is tiltable between a horizontal position and a non-horizontal position, and wherein said blocking cover is in the non-horizontal position during at least a portion of movement from the open position to the closed position, and wherein said blocking cover is in the horizontal position in the closed position.

3. The plasma processing apparatus of claim 1, further including a baffle plate positioned vertically above the blocking cover when the blocking cover is in the closed position, said baffle plate having a plurality of apertures therethrough to allow gas to flow from the processing chamber to the exhaust chamber when the blocking cover is in the open position.

4. A plasma processing apparatus comprising:
a processing chamber that converts a processing gas introduced from a gas supply source into plasma and performs plasma processing on a target object;
an exhaust chamber that communicates with the inside of the processing chamber to exhaust a gas converted into plasma from the processing chamber;
a blocking cover that is provided in the exhaust chamber to block communication between the inside of the processing chamber and the inside of the exhaust chamber; and
a driving mechanism that supports and vertically moves the blocking cover, and wherein the driving mechanism moves the blocking cover vertically between an open position and a closed position, and wherein in said closed position the blocking cover closes and blocks gas flow from the processing chamber to the exhaust chamber, and wherein in the open position gas flow is allowed from the processing chamber to the exhaust chamber,
wherein the blocking cover is tiltable between a horizontal position and a non-horizontal position, and wherein said blocking cover is in the non-horizontal position during at least a portion of movement from the open position to the closed position, and wherein said blocking cover is in the horizontal position in the closed position.

* * * * *